United States Patent
Vonnahme

(10) Patent No.: US 11,888,585 B2
(45) Date of Patent: Jan. 30, 2024

(54) METHOD FOR OPERATING A NETWORK PARTICIPANT IN AN AUTOMATION COMMUNICATION NETWORK

(71) Applicant: Beckhoff Automation GmbH, Verl (DE)

(72) Inventor: Erik Vonnahme, Salzkotten (DE)

(73) Assignee: Beckhoff Automation GmbH, Verl (DE)

( * ) Notice: Subject to any disclaimer, the term of this patent is extended or adjusted under 35 U.S.C. 154(b) by 263 days.

(21) Appl. No.: 17/316,254

(22) Filed: May 10, 2021

(65) Prior Publication Data

US 2021/0266084 A1 Aug. 26, 2021

Related U.S. Application Data

(63) Continuation of application No. PCT/EP2019/081727, filed on Nov. 19, 2019.

(30) Foreign Application Priority Data

Nov. 20, 2018 (DE) ...................... 10 2018 129 189.2

(51) Int. Cl.
*G06F 1/12* (2006.01)
*H04B 10/61* (2013.01)
(Continued)

(52) U.S. Cl.
CPC .......... *H04J 3/0644* (2013.01); *H04J 3/0661* (2013.01); *H04L 69/28* (2013.01)

(58) Field of Classification Search
CPC ...... H04J 3/0644; H04J 3/0655; H04J 3/0661; H04J 3/0697; G05B 19/042; H03L 7/16;
(Continued)

(56) References Cited

U.S. PATENT DOCUMENTS 2,292,387 A * 8/1942 Markey .................... H04L 9/12
331/37
4,975,930 A * 12/1990 Shaw ................. G11B 20/1403
331/25
(Continued)

FOREIGN PATENT DOCUMENTS

AU 2017202093 A1 10/2017
CN 1706144 A 12/2005
(Continued)

OTHER PUBLICATIONS

International Search Report and Written Opinion dated Feb. 7, 2020 in connection with International Patent Application No. PCT/EP2019/081727, 18 pages including English translation.
(Continued)

*Primary Examiner* — Edan Orgad
*Assistant Examiner* — Vanneilian Lalchinthang
(74) *Attorney, Agent, or Firm* — Dorsey & Whitney LLP

(57) ABSTRACT

A network subscriber of an automation communication network is provided to exchange data with further network subscribers in the automation communication network at a predetermined clock frequency. The network subscriber has an internal clock for synchronizing the data exchange with at least one other network subscriber. The internal clock is embodied to provide a time as an integer count value. The clock frequency is determined in such a way that a period duration per clock pulse cannot be represented as an integer count value by the internal clock. A method of operating the network subscriber in the automation communication network comprises the following method step: the internal clock is incremented with a predetermined sequence of integer increments. The sequence of integer increments is predetermined such that a sum of the integer increments corresponds to an integer multiple of the period duration.

7 Claims, 3 Drawing Sheets

(51) Int. Cl.
*H04J 3/06* (2006.01)
*H04L 69/28* (2022.01)

(58) Field of Classification Search
CPC ....... H03L 7/1974; H04L 12/40; H04L 69/28; H04L 2012/402; H04B 10/616; H04B 10/61; H04B 10/6162; H03K 23/66
USPC .......................................................... 370/503
See application file for complete search history.

(56) References Cited

U.S. PATENT DOCUMENTS

| | | | | |
|---|---|---|---|---|
| 6,014,406 | A * | 1/2000 | Shida | H04B 1/7156 370/312 |
| 7,228,450 | B2 * | 6/2007 | Fuehrer | G06F 1/04 713/500 |
| 7,362,834 | B2 * | 4/2008 | Fuehrer | G06F 1/08 713/400 |
| 2002/0129291 | A1 | 9/2002 | Gonzalez | |
| 2005/0107103 | A1 | 5/2005 | Melpignano | |
| 2006/0077917 | A1* | 4/2006 | Brahmajosyula | H04L 12/66 370/310 |
| 2006/0112191 | A1* | 5/2006 | Ooi | H04J 3/0658 709/248 |
| 2015/0372764 | A1* | 12/2015 | Kaneda | H04B 10/616 398/115 |
| 2016/0191185 | A1* | 6/2016 | Webb, III | H04J 3/0697 370/503 |
| 2017/0150464 | A1* | 5/2017 | Kazehaya | H04J 3/0641 |
| 2017/0276474 | A1* | 9/2017 | Shimada | G01B 11/14 |
| 2019/0013986 | A1 | 1/2019 | Shao et al. | |
| 2019/0094837 | A1* | 3/2019 | Oh | G05B 19/418 |
| 2022/0124661 | A1* | 4/2022 | Schlotthauer | H04B 1/7156 |

FOREIGN PATENT DOCUMENTS

| | | |
|---|---|---|
| CN | 106664093 A | 5/2017 |
| DE | 102019123348 A1 | 3/2021 |
| EP | 0367378 B1 | 9/1996 |
| JP | H09284858 A | 10/1997 |
| WO | 02075993 A2 | 9/2002 |
| WO | 02076031 A2 | 9/2002 |
| WO | 03071741 A1 | 8/2003 |
| WO | 02075993 A3 | 10/2003 |
| WO | 2013048770 A1 | 4/2013 |
| WO | WO-2013048770 A1 * | 4/2013 ............... H03L 7/16 |
| WO | 2021037952 A1 | 3/2021 |

OTHER PUBLICATIONS

"IO-Link Wireless System Extensions: Specification" IO-Link Community, Karlsruhe, Germany, Version 1.1, Mar. 2018, 302 pages.

Office Action dated Apr. 30, 2020 in connection with German patent application No. DE 10 2019 123 348.8, 19 pages including English translation.

Preview of International Standard "Programmable Controllers" IEC 61131-9, Edition 1.0, Sep. 2013, 39 pages.

International Search Report and Written Opinion dated Nov. 6, 2020 in connection with International Patent Application No. PCT/EP2020/073920, 21 pages including English translation.

International Preliminary Report on Patentability dated Nov. 24, 2021 in connection with International Patent Application No. PCT/EP2020/073920, 24 pages including English translation.

Intention to Grant dated Nov. 24, 2021 in connection with European Patent Application No. 19806191.3, 12 pages including English translation.

Ryan, Colin , et al., Ryan, Colin et al. "Clock synchronisation on multiple TTCAN network channels," Microprocessors and Microsystems 28, 2004, pp. 135-146.

Office Action dated Aug. 12, 2022 in connection with Chinese patent application No. 202080057714.X, 9 pages including English translation.

Office Action dated Nov. 18, 2021 in connection with Chinese patent application No. 201980076290.9, 8 pages including translation.

"EtherCAT—the Ethernet Fieldbus," EtherCAT Technology Group, Nov. 2012, 21 pages.

* cited by examiner

Fig. 3

| k (100) | $N_k$ (101) | $\Sigma N_k$ (104) | $(\Sigma N_k) - nT$ (107) | $N_k$ (102) | $\Sigma N_k$ (105) | $(\Sigma N_k) - nT$ (108) | $N_k$ (103) | $\Sigma N_k$ (106) | $(\Sigma N_k) - nT$ (109) |
|---|---|---|---|---|---|---|---|---|---|
| 1 | 6 | 6 | -0,4 | 7 | 7 | 0,6 | 6 | 6 | -0,4 |
| 2 | 7 | 13 | 0,2 | 6 | 13 | 0,2 | 6 | 12 | -0,8 |
| 3 | 6 | 19 | -0,2 | 6 | 19 | -0,2 | 6 | 18 | -1,2 |
| 4 | 7 | 26 | 0,4 | 6 | 25 | -0,6 | 7 | 25 | -0,6 |
| 5 | 6 | 32 | 0 | 7 | 32 | 0 | 7 | 32 | 0 |

METHOD FOR OPERATING A NETWORK PARTICIPANT IN AN AUTOMATION COMMUNICATION NETWORK

CROSS-REFERENCE TO RELATED APPLICATIONS

This application is a continuation of International Patent Application PCT/EP2019/081727, Method for Operating a Network Participant in an Automation Communication Network," filed 19 Nov. 2019, which claims priority to German Patent Application DE 10 2018 129 189.2, VERFAHREN ZUM BETREIBEN EINES NETZWERKTEILNEHMERS IN EINEM AUTOMATISIERUNGSKOMMUNIKATIONSNETZWERK, filed 20 Nov. 2018, each of which is incorporated by reference herein, in the entirety and for all purposes.

FIELD

The present invention relates to a method of operating a network subscriber in an automation communication network.

BACKGROUND

It is known from the prior art to synchronize data exchange between network subscribers in an automation communication network with clocks distributed in the automation communication network. For example, EP2544389B1 discloses a method for work-clock and time-clock synchronization of a subordinate domain of an automation network.

To synchronize a data exchange in an automation communication network, clocks are typically used that are embodied to provide times as integer count values. Data exchange in the automation communication network takes place at a fixed clock frequency. The clock frequency may be set in such a way that a period duration per clock pulse cannot be represented as an integer count value by the clocks. If the clocks are incremented with the clock frequency, deviations of the count values of the clocks result that amount to multiples of the period duration result. Deviations of the count values of the clocks from a multiple of the period duration may negatively influence a synchronous data exchange.

A solution to this problem is to increment the clocks at a frequency different from the clock frequency and transform a clock domain of the clocks into a clock domain of the data exchange. However, such transformation is not without delays. Said delays cause deviations of the times provided by the clocks from a reference time. Such a deviation is also referred to as jitter. Jitter may e.g. result in a datagram exchanged as part of the data exchange being provided with an incorrect time stamp.

The object of the present invention is to provide an improved method for operating a network subscriber in an automation communication network, to provide a network subscriber embodied to perform the method, and to provide an automation communication network having at least two network subscribers embodied to perform the method.

SUMMARY

These objects are solved by a method for operating a network subscriber in an automation communication network with the features of independent claim 1, by a network subscriber with the features of independent claim 6 and by an automation communication network with the features of independent claim 7. Advantageous further embodiments are indicated in dependent claims.

EXAMPLES

A network subscriber of an automation communication network is provided to exchange data with further network subscribers in the automation communication network with a predetermined clock frequency. The network subscriber comprises an internal clock for synchronizing the data exchange with at least one further network subscriber. The internal clock is embodied to provide a time as an integer count value. The clock frequency is predetermined such that the internal clock cannot represent a period duration per clock pulse by an integer count value. A method of operating the network subscriber in the automation communication network includes the following method step: the internal clock is incremented using a predetermined sequence of integer increments. The sequence of integer increments is determined such that a sum of the integer increments corresponds to an integer multiple of the period duration.

Advantageously, a count value of the internal clock after incrementing the internal clock with the sequence of increments corresponds to an ideal count value of the internal clock. The ideal count value corresponds to a multiple of the period duration that cannot be represented by the internal clock as an integer count value. After incrementing the internal clock with the sequence of increments, the ideal count value corresponds to the integer multiple of the period duration. Thus, at least after incrementing with the sequence of increments, the internal clock is adapted to the clock frequency of the data exchange. Deviations of count values of the internal clock from ideal count values after individual incrementing steps, i.e. before the incrementing of the internal clock with the sequence of increments has been completed, may be limited to rounding errors. This may enable synchronous data exchange of the network subscriber with other network subscribers in the automation communication network.

Generating the time of the internal clock is based on the clock frequency of the data exchange in the automation communication network. Advantageously, this means that the generated time of the internal clock does not have to be transformed into a clock domain of the data exchange. Such a transformation is not without delay, and the delay is particularly not constant so that it cannot be statically included. A deviation of the time provided by the internal clock from a system time of a reference clock caused by the delay during data exchange is also referred to as jitter. A jitter may result in a datagram exchanged during data exchange being provided with an incorrect time stamp. The delay caused by the transformation from a clock domain of the internal clock to the clock domain of the data exchange in the automation communication network is advantageously eliminated in the process. As a result, accurate time stamps may be assigned to datagrams exchanged in the automation communication network.

In an embodiment, the sequence of integer increments is an alternating sequence of a first increment and a second increment. The first increment is the largest integer that is less than the period duration. The second increment is the smallest integer that is greater than the period duration. Advantageously, deviations of the count value of the internal clock, the count value being represented as an integer, from an ideal count value for the alternating sequence after each increment step or after each clock pulse are limited to rounding errors.

In another embodiment of the method, an order of the increments is determined such that after each clock pulse, a deviation of a sum of increments of clock pulses that have already occurred from a multiple of the period duration is minimal. Deviations of the count value of the internal clock from a multiple of the period duration may influence the data exchange in the automation communication network. For example, receive times of datagrams are provided with times of internal clocks. Also, different network subscribers must output signals at specified times. For these reasons, a deviation of the count value of the internal clock from a multiple of the period duration may negatively influence a synchronous data exchange in the automation communication network. Advantageously, such an influence can be minimized by a fixed order of the increments of the sequence of increments.

In an embodiment, a drift of the internal clock of the network subscriber compared to a reference clock of the automation communication network is taken into account by adjusting at least one increment of the sequence of increments. Advantageously, synchronous data exchange is maintained if a drift of the internal clock is taken into account and compensated.

In another embodiment, incrementing of the internal clock is repeated with the sequence of integer increments. This advantageously maintains the synchronicity of the data exchange.

A network subscriber is provided to exchange data with further network subscribers in an automation communication network with a predetermined clock frequency. The network subscriber has an internal clock for synchronizing the data exchange with at least one other network subscriber. The internal clock is arranged to provide a time in as an integer count value. The clock frequency is predetermined in such a way that a period duration per clock pulse cannot be represented as an integer count value by the internal clock. The network subscriber comprises an internal control device. The internal control device is adapted to increment the internal clock with a predetermined sequence of integer increments. The sequence of integer increments is predetermined in such a way that a sum of integer increments corresponds to an integer multiple of the period duration.

An automation communication network comprises at least two network subscribers. The network subscribers are connected to one another via a field bus for exchanging data. In addition, the automation communication network comprises a control device of the automation communication network connected to the network subscribers.

BRIEF DESCRIPTION OF THE DRAWINGS

The above-described features, characteristics and advantages of the present invention, as well as the manner in which they are achieved, will become clearer and more easily understood in connection with the following description of embodiments, which will be explained in more detail in connection with the drawings. Thereby, in each case, schematic depictions show:

FIG. 3 a table showing different possibilities of incrementing a network subscriber's internal clock using a sequence of integer increments.

DETAILED DESCRIPTION

Figure 1:
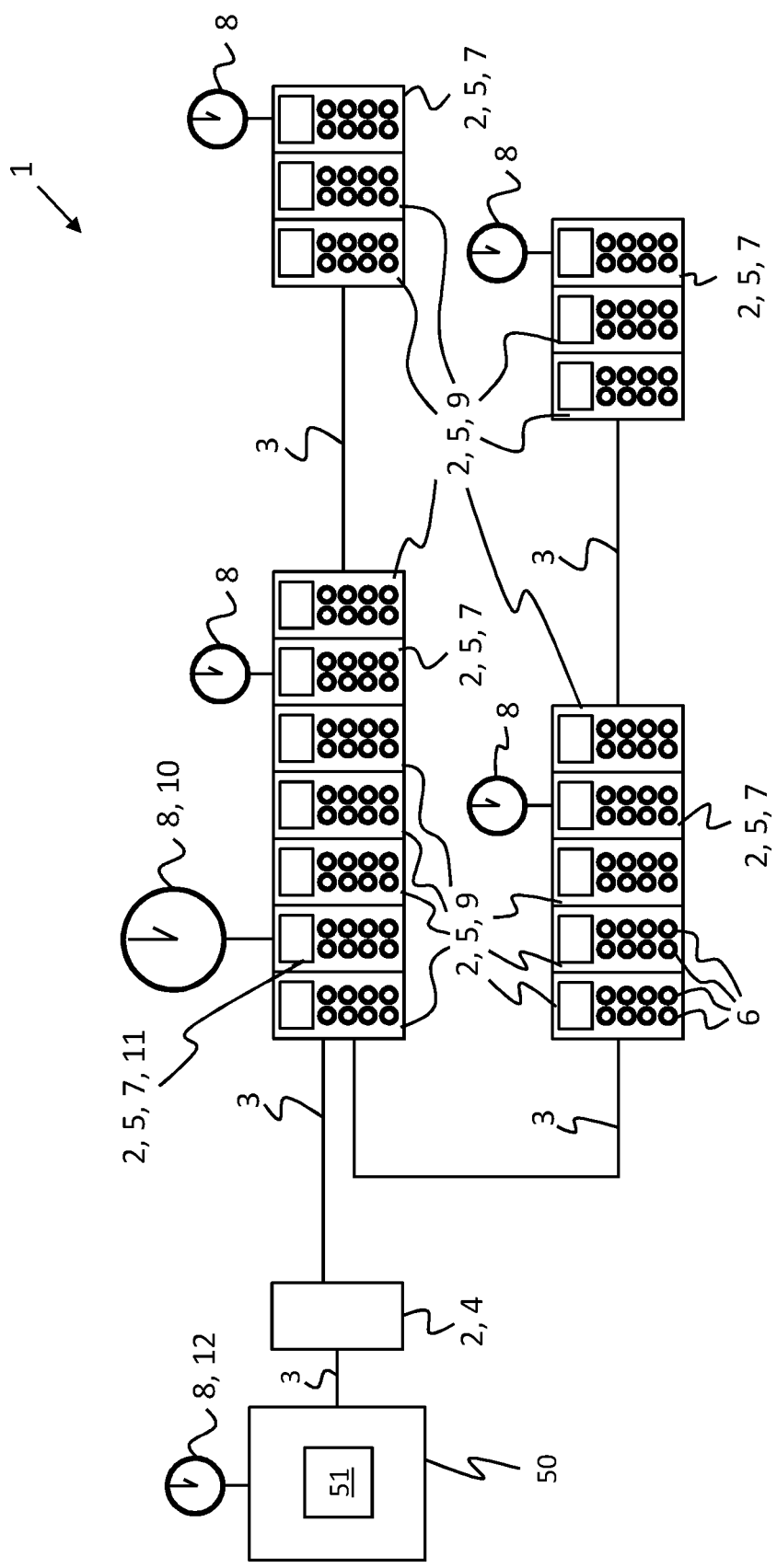
FIG. 1 an exemplary automation communication network.

FIG. 1 schematically shows an automation communication network 1.

The automation communication network 1 comprises a plurality of network subscribers 2 and a control device 50. Exemplarily, the automation communication network 1 has nineteen network subscribers 2. However, the automation communication network 1 may comprise a different number of network subscribers 2. A topology of the automation communication network 1 may differ from the exemplary topology shown in FIG. 1. The control device 50 has a master 51 which is e.g. embodied as software and may control at least a communication process, i.e. a data exchange, between the network subscribers 2 and the control device 50 on a field bus 3. The automation communication network 1 has a superordinate network subscriber 4. The superordinate network subscriber 4 may also be referred to as a bus coupler. Furthermore, the automation communication network 1 comprises network subscribers 5 that are subordinate to the superordinate network subscriber 4.

The control device 50 is connected to the higher-level network subscriber 4 via the field bus 3. The network subscribers 2 are also connected to one another via the field bus 3. The network subscribers 2 and the control device 50 may exchange data with one another via the field bus 3. For example, the network subscribers 2 and the control device 50 may be embodied to exchange data based on the EtherCAT protocol. Accordingly, the master 51 is embodied to transmit or receive datagrams according to the EtherCAT protocol. The subordinate network subscribers 5 each have a connection device for processing exchanged data. The connection units may also be referred to as slaves. The connection units may be application-specific integrated circuits (ASIC) or field programmable gate arrays (FPGA); e.g. the connection units of the subordinate network subscribers 5 in FIG. 1.

The subordinate network subscribers 5 are embodied as input/output devices with connections 6 for field devices. The field devices may be sensors and actuators; e.g., field devices connected to the automation communication network 1 in FIG. 1.

Furthermore, the subordinate network subscribers 5 each have an internal control device; e.g., internal control devices in FIG. 1. The internal control devices are each connected to the connection units via a data line. The internal control devices are embodied to control the field devices on the basis of data processed by the connection units.

The automation communication network 1 has network subscribers 7 that are to be synchronized with one another with regard to exchanging data. As an example, the automation communication network 1 of FIG. 1 has five network subscribers 7 to be synchronized with one another. However, the automation communication network 1 may also have a different number of network subscribers 7 to be synchronized with one another. The automation communication network 1 comprises at least two network subscribers 7 to be synchronized with one another. For the purpose of synchronizing the data exchange, the network subscribers 7 to be synchronized each have an internal clock 8. Network subscribers 9 that are not to be synchronized with one another do not each have an internal clock 8. An arrangement of the network subscribers 7 to be synchronized and of the network subscribers 9 not to be synchronized in the automation communication network 1 may deviate from the depiction of FIG. 1.

The internal clocks 8 of the network subscribers 7 to be synchronized are part of the connection units. The internal clocks 8 may e.g. be embodied as oscillating crystals. The internal clocks 8 are each embodied as incrementing counters. The internal clocks 8 are embodied to provide a time as an integer count value. The internal clocks 8 form a system of distributed clocks in the automation communication network 1.

The internal clock 8 of a connection unit arranged in the automation communication network 1 as the first slave with an internal clock 8 after the master 51 serves as the reference clock 10. This is indicated in FIG. 1 by the fact that the internal clock 8 of a first slave network subscriber 11 is shown as the largest clock. The reference clock 10 may e.g. be adapted to a global clock, for example a clock defined according to the IEEE 1588 standard (grandmaster clock). The reference clock 10 is embodied to provide a system time. The reference clock 10 is provided for synchronizing the network subscribers 7 on short time scales, e.g. on a sub-millisecond time scale. Thus, the synchronization of the network subscribers 7 with the reference clock 10 particularly relates to a real-time synchronization.

An absolute global time reference is provided by the internal clock 8 of the control device 50, which is part of the master 51 and will herein be referred to as the master clock 12. The master clock 12 may e.g. be based on a global time format, e.g. the time format of the time signal transmitter DCF77, or for example a time applicable within the automation communication network 1, e.g. provided by a BIOS clock. The master 51 is embodied to initialize the reference clock 10, to provide the system time using the master clock 12, and to synchronize the entire data exchange in the automation communication network 1. Since the real-time synchronization of the network subscribers 7 based on the reference clock 10 and the synchronization of the entire data exchange of the automation communication network 1 based on the master clock 12 are performed on different time scales, the master clock 12 does not violate a superordinate position of the reference clock 10 of the automation communication network 1.

Figure 2:
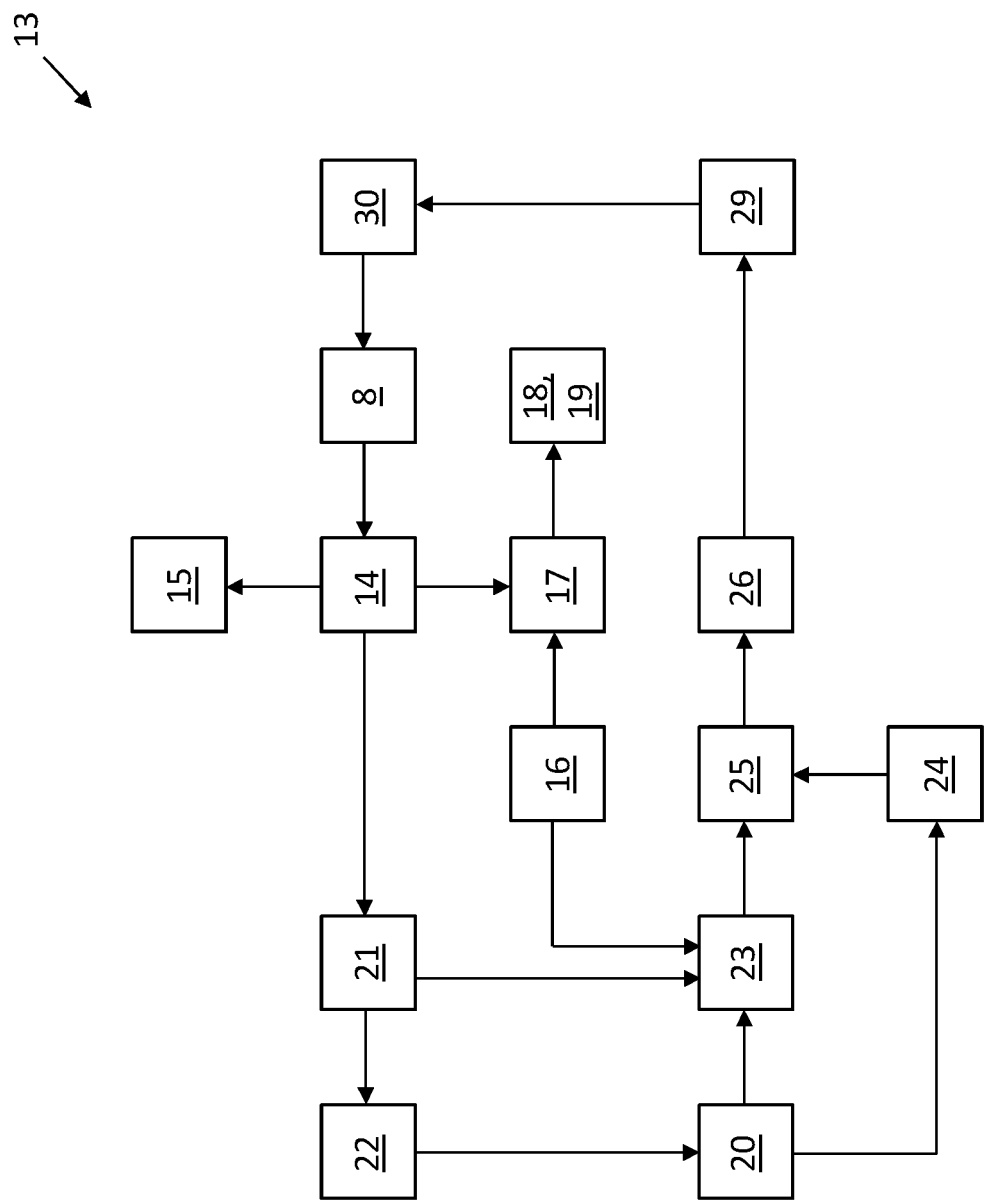
FIG. 2 a control principle for controlling an internal clock of a network subscriber to be synchronized in the automation communication network.

FIG. 2 schematically shows a control principle 13 for controlling an internal clock 8 of a network subscriber 7 to be synchronized in the automation communication network 1. The internal clock 8 is embodied as an incrementing counter and is embodied to provide a local time 14 of the network subscriber 7 to be synchronized as an integer count value.

The local time 14 may be provided to a synchronization manager (SyncManager) 15 of the slave. The synchronization manager 15 is provided for consistent and secure data exchange between the master 51 and the internal control device connected to the slave.

The master 51 may transmit a datagram to the slaves. The first slave of the first subordinate network subscriber 11 can store its system time based on the reference clock 10 in the datagram. Then, the datagram may be forwarded by the first slave to other slaves in the automation communication network 1. In this way, all slaves and the master may receive a copy of the system time.

The internal clocks 8 of the automation communication network 1 operate independently of one another. Since the internal clocks 8 can each be activated at different times, the internal clocks 8 may each have a time offset from one another. In particular, the internal clocks 8 may have a time offset 16 with respect to the reference clock 10. The time offset 16 with respect to the reference clock 10 may be compensated for locally in the respective slave for each internal clock 8. In order to be able to provide a uniform system time throughout the automation communication network 1, the time offset 16 of the internal clocks 8 with respect to the system time can be determined by the master 51 for each internal clock 8 and stored in a respective register of a slave. This allows a local copy 17 of the system time to be provided to each slave.

The local copies 17 of the system time may be used for SyncSignals 18 or for LatchSignals 19. SyncSignals 18 and LatchSignals 19 are signals that may serve to synchronize local applications with the data exchange of the automation communication network 1. SyncSignals 18 are output by a slave. A SyncSignal 18 may e.g. be an interrupt request. LatchSignals 19 are transmitted to a slave. SyncSignals 18 may be outputted by the slaves at defined times based on the local copies 17 of the system time. LatchSignals 19 transmitted to the slaves can be provided with defined time stamps (time stamping).

Since datagrams transmitted from the master 51 to the slaves must be processed in the slaves and forwarded to other slaves, a propagation delay 20 may occur when a datagram is transmitted. This may also be caused by finite cable lengths between the slaves. To synchronize the network subscribers 7, the propagation delay between the reference clock 10 and an internal clock 8 must be taken into account. To compensate for the effect of the propagation delay, the master 51 may transmit a datagram the reception times of which are stored by each slave based on the respective local time 14. These local receipt times 21 are each stored in a register 22 of a slave. The local receipt times 21 may e.g. be times at which a data field of the datagram is received at connections of the slaves or at processing devices of the slaves. The data field may e.g. be what is referred to as a start-of-frame data field that follows a preamble of the datagram. The master 51 may access the local receive times 21 and use them to determine a propagation delay 20 for each slave. A local receipt time 21 may thus be corrected with the propagation delay 20. By additionally considering the time offset 16, the result is a delay-corrected receipt time 23 based on the local copy 17 of the system time.

A further effect that may lead to deviations between an internal clock 8 and the reference clock 10 is a drift that may be caused by different clock speeds. If, for example, an internal clock 8, which is an incrementing counter indicating the local time 14 in an integer representation, increases its count value of the local time 14 by the value "10" in a clock pulse with a period duration of 10 ns, but the reference clock 10 advances by 9 ns per clock pulse, the internal clock 8 is faster than the reference clock 10.

To compensate for the effect of drift, the master 51 may transmit system times to the slaves at periodic intervals. The transmitted system times 24 which may also take into account a propagation delay 20 and the delay-corrected receipt time 23 based on the local copy 17 of the system time are provided to a comparison device 25. The comparison device 25 may also be referred to as a system-time-difference filter. The comparison device 25 is embodied to determine a mean system-time difference 26 between the periodically transmitted system times 24 and the delay-corrected received time 23 based on the local copy 17 of the system time. If the average system time difference 26 is positive, the internal clock 8 is faster than the reference clock 10.

Conversely, if the average system time difference 26 is negative, the internal clock 8 is slower than the reference clock 10.

Based on the mean system-time difference 26, a speed difference 29 between the internal clock 8 and the reference clock 10 is then determined, smoothed and provided to compensate for the drift of the internal clock 8.

If, for example, an internal clock 8 increases its count value of the local time 14 by the value "10" in a clock pulse with a period duration of 10 ns, but a clock period of the reference clock 10 deviates from the period duration of 10 ns, this deviation may increase over several clock pulses. The speed difference 29 is provided to a control device 30. The control device 30 may adjust the internal clock 8 based on the speed difference 29 to the reference clock 10. Adjusting may be carried out by occasionally increasing the count value of the internal clock 8 by the value "9" or by the value "11".

In operation of the automation communication network 1, all network subscribers 2 exchange data at a predetermined clock frequency. The clock frequency may e.g. be 100 MHz. The system of distributed internal clocks 8 of the automation communication network 1 may also be operated at a 100 MHz logic. A period duration per clock pulse is 10 ns at 100 MHz. In this case, it is suitable that an internal clock 8 increases its count value of the local time 14 by the value "10" in a clock pulse with a period duration of 10 ns. A time resolution is in this case 1 ns. Under these conditions, datagrams with a bit width of 1 bit are e.g. processed at a processing rate of 100 Mbit/s. In drift compensation, the count value of the local time 14 in the clock with the period duration of 10 ns may occasionally be increased e.g. by the value "9" or the value "11" instead of by the value "10".

It may be specified that the processing rate should be 1000 Mbit/s. In this case it is suitable to process datagrams with a width of 1 Byte (8 Bit) at a clock frequency of 125 MHz. The period duration per clock pulse is 8 ns. If the system of distributed internal clocks 8 is to be adapted to this clock, the internal clocks 8 may increase their count values of the local times 14 by the value "8" in a clock with a period duration of 8 ns. In case of a drift compensation, the count value of the local time 14 may occasionally be increased e.g. by the value "7" or by the value "9" in the clock with the period duration of 8 ns instead of by the value "8".

In the following description, a method for operating a network subscriber 7 to be synchronized in the automation communication network 1 is explained. The method is provided to synchronize a data exchange of the network subscriber 7 to be synchronized during operation of the automation communication network 1 with at least one further network subscriber 7. All network subscribers 2 of the automation communication network 1 are to exchange data at a clock frequency that is set such that the period duration per clock pulse cannot be represented by the internal clock 8 by an integer count value.

For example, for a processing rate of 10,000 Mbit/s, 64 bit wide datagrams may be processed at a clock frequency of 156.25 MHz. A period duration per clock pulse is in this case 6.4 ns. Since the internal clocks 8 are embodied to provide local times 14 as integer count values, this is not possible for the period duration of 6.4 ns. The register 22 of a slave in which for example local receive times 21 are stored may also only contain integer values.

In principle, it is possible that the local times 14 are generated with a clock domain other than a clock domain of the data processing. However, the system of distributed internal clocks 8 is coupled to data processing. For example, local receipt times 21 are assigned to the datagram when the propagation delay 20 is determined. If datagrams in the automation communication network 1 are processed at a predetermined clock frequency, but the system of distributed internal clocks 8 operates in a different clock domain, the local times 14 must be transformed from their clock domain to the clock domain of the data processing. However, this transformation is not without delay and may lead to additional deviations of the local times 14 from the system time during data exchange. As a result, the receipt time of a datagram may have an increased error rate during transformation. For this reason, in the method for operating a network subscriber 7 to be synchronized, the local time 14 of the network subscriber 7 to be synchronized is to be generated on the basis of the clock frequency of the data processing.

The method comprises a method step in which the internal clock 8 of the network subscriber 7 to be synchronized is incremented with a predetermined sequence of integer increments. The sequence of integer increments is predetermined such that a sum of the integer increments of the sequence of increments corresponds to an integer multiple of the period duration, wherein the period duration per clock pulse cannot be represented as an integer count value by the internal clock 8. Thus, the method is based on the fact that the sequence of integer increments is predetermined in such a way that a deviation of the count value of the internal clock 8 from an ideal count value of the internal clock 8 after incrementing the internal clock 8 is compensated for with the sequence of increments. The ideal count value corresponds to a product of a number of clocks or, respectively, by a number of increments of the sequence of increments and the period duration that cannot be represented by an integer count value and which is to be referred to as an ideal increment.

In the 156.25 MHz logic example, e.g. a sequence of increments "6" and "7" may be selected. For example, the sequence of increments (6, 6, 6, 7, 7) provides a sum of increments with a value of "32". This corresponds to five times the ideal increment with a value of "6.4". After incrementing the internal clock 8 with the sequence (6, 6, 6, 7, 7), the count value of the internal clock 8 thus does not deviate from the ideal count value "32".

FIG. 3 depicts a table showing different possibilities of incrementing an internal clock 8 of a network subscriber 7 to be synchronized with a sequence of integer increments. As an example, the ideal increment per clock pulse is considered to be "6.4".

The table of FIG. 3 shows a column 100 in which numbers of the clock pulses or numbers of the increments of the sequence of increments "k" are entered. In a first column 101 a first sequence of increments "$N_k$" is entered. In a second column 102, a second sequence of increments "$N_k$" is entered. In a third column 103, a third sequence of increments "$N_k$" is entered. The first, the second and the third sequence of increments differ with respect to a sequence of integer increments "6" and "7". The first sequence of increments is (6, 7, 6, 7, 6). The second sequence of increments is (7, 6, 6, 6, 7). The third sequence of increments is (6, 6, 6, 7, 7).

In a fourth column 104, sums "$\Sigma N_K$" are entered above the increments of the first sequence. For example, after the third clock pulse (k=3) $\Sigma N_k = N_1 + N_2 + N_3$. After the fifth clock pulse (k=5), $\Sigma N_k = N_1 + N_2 + N_3 + N_4 + N_5$. Similarly, in a fifth column 105 and in a sixth column 106, sums "ΣN" are entered above the increments of the second sequence or the third sequence, respectively. The sums over the increments of the integer increments of the respective sequence of increments are "32" in each case after the fifth clock pulse (k=5). The respective sums of the increments are identical and correspond to an integer multiple of the ideal increment "6.4".

In a seventh column 107 deviations "($\Sigma N_k$)–nT" of the count value of an internal clock 8 after one clock pulse of the ideal count value for the first sequence of increments are entered. "T" corresponds to the period duration or the ideal increment, respectively; "n" denotes a final value of the sums for the clock pulse "k". Similarly, in an eighth column 108 and in a ninth column 109, deviations "($\Sigma N_k$)–nT" of the count values of internal clocks 8 after a clock pulse of the ideal count value are entered for the second and the third sequence of increments, respectively.

From the deviations "($\Sigma N_k$)–nT", it can be seen that the sequence of increments "6" and "7" has an influence on the deviations. For example, the third sequence of increments (6, 6, 6, 7, 7) has a maximum deviation of "–1.2" after the third clock pulse. For the second sequence of increments (7, 6, 6, 6, 7), a maximum deviation is "+0.6" after the first clock or "–0.6" after the fourth clock, respectively. By using the second sequence of increments instead of the third sequence of increments to increment an internal clock 8, i.e. by adjusting the order of the sequence of increments, a maximum deviation can be reduced in the method of operating a network subscriber 7 to be synchronized.

The first sequence of increments (6, 7, 6, 7, 6) is an alternating sequence of increments "6" and "7". A maximum deviation in this case is "–0.4" after the first clock pulse or "+0.4" after the fourth clock pulse, respectively. Thus, by using the first sequence of increments instead of the second sequence of increments to increment an internal clock 8, a maximum deviation may further be reduced in the method of operating a network subscriber 7 to be synchronized. The first sequence of increments represents a sequence for which the maximum deviation has been minimized.

Thus, in general, a sequence of integer increments may be selected in the method which is an alternating sequence of a first increment and a second increment. The first increment is the largest integer smaller than the period duration or the ideal increment, respectively. The second increment is the smallest integer that is larger than the period duration or than the ideal increment, respectively.

In the first sequence of increments, increment "6" represents the first increment. The increment "7" represents the second increment. Whether the alternating sequence should be started with the first increment or with the second increment depends on the ideal increment. For an ideal increment of "6.4", it is suitable to start the alternating sequence with the first increment, since a deviation of the first increment from the ideal increment in this case is smaller than a deviation of the second increment from the ideal increment. If, for example, the ideal increment is "6.6", it is suitable to start the alternating sequence with the second increment.

In general, a sequence of integer increments may be selected for the method, the order of which is determined in such a way that after each clock pulse a deviation of a sum of increments of already performed clock pulse from a multiple of the period duration is minimal. This is e.g. the case for the first sequence of increments.

In the operation of the automation communication network 1 at a clock frequency determined such that the period duration per clock pulse cannot be represented as an integer count value by an internal clock 8, the method may be repeated. Thus, incrementing an internal clock 8 with the sequence of integer increments may be repeated to maintain the synchrony of the network subscriber 7 with other network subscribers 7.

In the method, a drift of the internal clock 8 of the network subscriber 7 to be synchronized compared to the reference clock 10 of the automation communication network 1 may also be taken into account by adjusting at least one increment of the sequence of increments. In doing so, the compensation of the drift should preferably take place at a time when the drift was detected, since otherwise the deviation associated with the drift accumulates with an increasing number of clock pulses.

Incrementing the internal clock 8 using the adjusted sequence of integer increments may also be repeated in order to maintain synchrony of the network subscriber 7 with additional network subscribers 7.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

The invention claimed is:

1. A method for operating a network subscriber in an automation communication network,
   wherein the network subscriber is provided for exchanging data with further network subscribers in the automation communication network at a predetermined clock frequency,
   wherein the network subscriber comprises an internal clock for synchronizing the data exchange with at least one further network subscriber, wherein the internal clock is configured to provide a time as an integer count value, and
   wherein the clock frequency is predetermined in such a way that a period duration per clock pulse cannot be represented as the integer count value by the internal clock;
   wherein the method comprises the following:
      incrementing the internal clock with a predetermined sequence of integer increments,
      wherein the sequence of integer increments is determined in such a way that a sum of the integer increments corresponds to an integer multiple of the period duration.

2. The method of claim 1,
   wherein the sequence of integer increments is an alternating sequence of a first increment and a second increment,
   wherein the first increment is a largest integer that is less than the period duration, and
   wherein the second increment is a smallest integer that is larger than the period duration.

3. The method according to claim 1, wherein a sequence of the integer increments is predetermined such that after each clock pulse a deviation of a sum of increments of already occurred clock pulses from a multiple of the period duration is minimal.

4. The method according to claim 1, wherein a drift of the internal clock of the network subscriber compared to a reference clock of the automation communication network is taken into account by adjusting at least one increment of the sequence of integer increments.

5. The method according to claim 1, wherein the incrementing of the internal clock is repeated with the sequence of integer increments.

6. A network subscriber, which is provided for exchanging data with further network subscribers in an automation communication network with a predetermined clock frequency,
- wherein the network subscriber comprises an internal clock for synchronizing the data exchange with at least one further network subscriber, wherein the internal clock is configured to provide a time as an integer count value,
- wherein the clock frequency is determined such that a period duration per clock pulse cannot be represented as the integer count value by the internal clock,
- wherein the network subscriber comprises an internal control device, wherein the internal control device is configured to increment the internal clock with a predetermined sequence of integer increments, and
- wherein the sequence of integer increments is determined in such a way that a sum of the integer increments corresponds to an integer multiple of the period duration.

7. An automation communication network comprising at least two network subscribers provided for exchanging data with further network subscribers in said automation communication network with a predetermined clock frequency,
- wherein the at least two network subscribers each comprise an internal clock for synchronizing the data exchange with at least one further network subscriber, wherein the internal clock is configured to provide a time as an integer count value,
- wherein the clock frequency is determined such that a period duration per clock pulse cannot be represented as the integer count value by the internal clock,
- wherein the at least two network subscribers each comprise an internal control device, wherein the internal control device is configured to increment the internal clock with a predetermined sequence of integer increments, and
- wherein the sequence of integer increments is determined in such a way that a sum of the integer increments corresponds to an integer multiple of the period duration;
- wherein the network subscribers are connected to one another via a field bus for exchanging the data, and
- wherein the network subscribers are connected to a control device of the automation communication network.

* * * * *